(12) United States Patent
Lo

(10) Patent No.: US 6,373,701 B1
(45) Date of Patent: Apr. 16, 2002

(54) HEAT DISSIPATION ASSEMBLY

(75) Inventor: Wei-Ta Lo, Miou-Li (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/697,705

(22) Filed: Oct. 25, 2000

(30) Foreign Application Priority Data

Jun. 14, 2000 (TW) ..................................... 89210169 U

(51) Int. Cl.[7] ................................................. H05K 7/20
(52) U.S. Cl. ...................... 361/704; 165/80.2; 165/185; 174/16.3; 257/719; 257/722; 361/710; 361/715
(58) Field of Search ................................. 165/80.2, 80.3, 165/185; 174/16.3; 257/706–707, 712–713, 718–719, 722, 726–727; 361/690, 697, 706, 707, 710, 717–718, 722

(56) References Cited

U.S. PATENT DOCUMENTS

| 5,353,193 A | * 10/1994 | Chia et al. | 361/704 |
| 5,893,409 A | * 4/1999 | Kohler | 257/718 |
| 5,969,950 A | * 10/1999 | Tantoush | 257/719 |
| 6,176,304 B1 | * 1/2001 | Lee | 165/185 |

* cited by examiner

Primary Examiner—Gregory Thompson
(74) Attorney, Agent, or Firm—Wei Te Chung

(57) ABSTRACT

A heat dissipation assembly (20) includes a heat sink (10) and a metal plate (30). The heat sink includes a chassis (14) and a plurality of fins (12). The chassis forms a pair of tabs (17) depending from each of two opposite sides of a bottom surface (15) of the chassis. First and second flanges (18, 19) respectively depend from the opposite sides, between the tabs. A material (45) with low thermal resistance is arranged between the metal plate and the chassis. The metal plate is attached to the bottom surface of the chassis. The flanges are bent inwardly to fasten the metal plate to the chassis.

10 Claims, 5 Drawing Sheets

HEAT DISSIPATION ASSEMBLY

BACKGROUND OF THE INVENTION

1. Field of the Invention

The present invention relates to a heat dissipation assembly, and more particularly to a heat dissipation assembly consisting of two parts having different heat conductive characteristics.

2. Related Art

Many computer electronic devices such as central processing units (CPUs) generate large amounts of heat. Excessive heat can adversely affect the stability and operation of a computer. Heat generated by a CPU must be dissipated quickly, to maintain normal operation of the computer. Generally, a heat dissipating assembly incorporating a heat sink is mounted on an upper surface of the CPU.

Conventionally, a heat sink has a plurality of fins for enhancing heat convection. The heat sink is manufactured as a single unit, by extrusion. Limitations inherent in the extrusion process restrict the height of the fins which can be formed. Thus the surface area of the fins is limited, and is frequently insufficient for dissipating large amounts of heat.

To overcome the above problem, other conventional devices have been developed. For instance, a copper plate is attached to a bottom surface of the heat sink using thermal tape. A bottom surface of the copper plate is then attached to an upper surface of the CPU. The copper plate has better heat transfer characteristics than the heat sink. However, the heat conductivity of the thermal tape is usually lower than that of the heat sink, and much lower than that of the copper plate. Thus the assembly does not effectively dissipate large amounts of heat generated by the CPU. An example of such heat dissipation assembly is disclosed in U.S. Pat. No. 5,653,280.

Additionally, thermal grease has been used in place of thermal tape, because it has better heat conduction characteristics. However, thermal grease is not adhesive enough to firmly secure the copper plate to the heat sink.

Thus an improved heat dissipation assembly which overcomes the problems of the prior art is desired.

SUMMARY OF THE INVENTION

Accordingly, an object of the present invention is to provide a heat dissipation assembly which includes a heat sink and a metal plate attached to a bottom surface of the heat sink, for attaining improved heat conduction.

A further object of the present invention is to provide a heat dissipation assembly which reliably attaches the heat sink to the metal plate.

To achieve the above objects, a heat dissipation assembly includes a heat sink and a metal plate. The heat sink includes a chassis and a plurality of fins. A pair of tabs depends from each of two opposite sides of a bottom surface of the chassis. First and second flanges respectively depend from the opposite sides of the bottom surface, between the tabs. A material with low thermal resistance is arranged between the metal plate and the chassis. The metal plate is attached to the bottom surface of the chassis. The flanges are bent inwardly to fasten the metal plate to the chassis.

Other objects, advantages and novel features of the present invention will be drawn from the following detailed embodiments of the present invention with attached drawings, in which:

DESCRIPTION OF THE PREFERRED EMBODIMENTS

Figure 1:
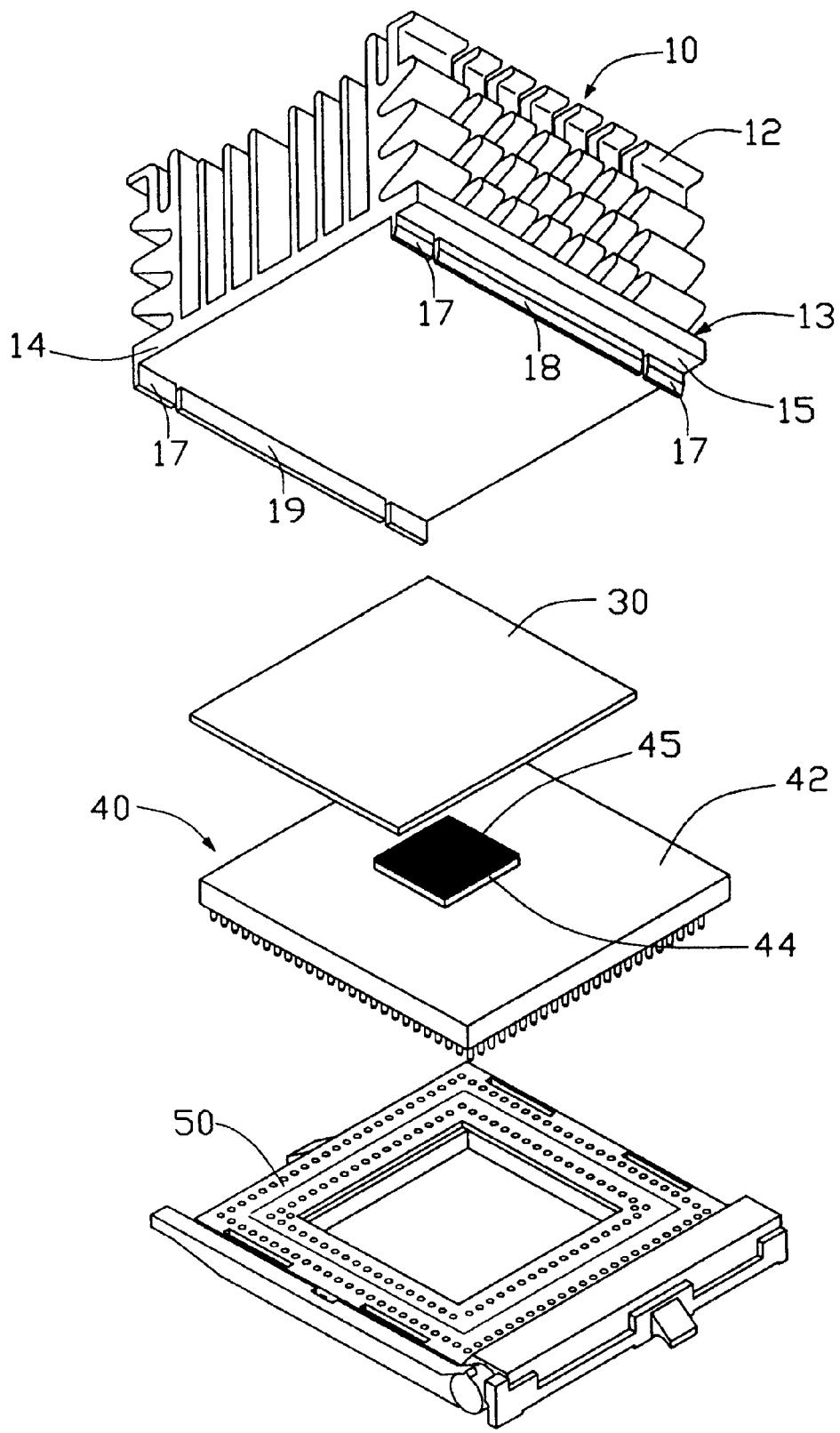
FIG. 1 is an exploded view of a heat dissipation assembly in accordance with the present invention, for mounting onto a flip chip processor retained in a socket.

Referring to FIG. 1, a heat dissipation assembly 20 in accordance with a preferred embodiment of the present invention comprises an extruded heat sink 10 and a metal plate 30. The metal plate 30 is made from material such as copper, giving it better heat conductive characteristics than the heat sink 10. A typical heat generating electronic device is a flip chip processor 40, which comprises a flip chip 44 supported on a substrate 42. The flip chip processor 40 is typically mounted on a socket 50 which is used for electrically connecting the processor 40 with a printed circuit board (not shown) on which the socket 50 is mounted.

Figure 2:
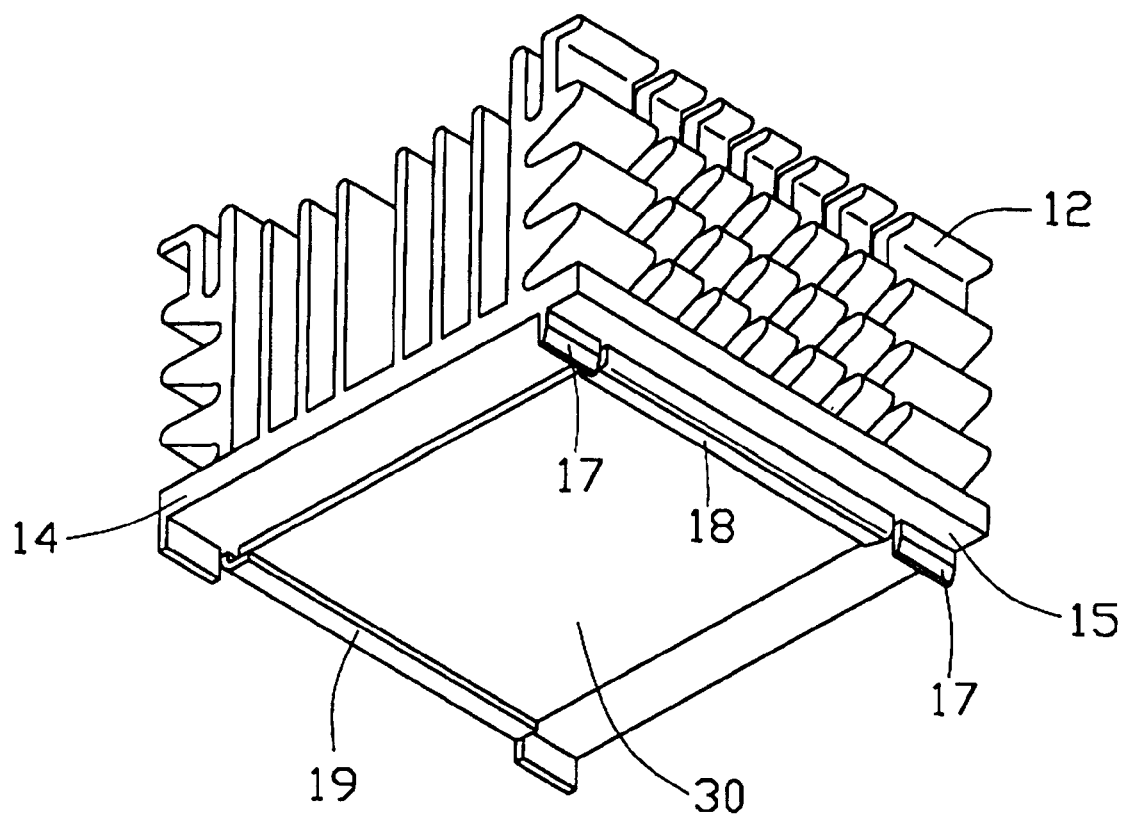
FIG. 2 is an assembled view of the heat dissipation assembly of FIG. 1.

Referring also to FIG. 2, the heat sink 10 includes a chassis 14 and a plurality of fins 12. The chassis 14 comprises a top surface 13 and a bottom surface 15. The fins 12 extend upwardly from the top surface 13 of the chassis 14. A pair of tabs 17 depends from each of two opposite sides of the bottom surface 15 of the chassis 14. First and second flanges 18, 19 respectively depend from the same two opposite sides of the bottom surface 15, in alignment with and between two respective tabs 17. A space (not labeled) is defined between the flanges 18, 19, for receiving the metal plate 30 therein.

The metal plate 30 is generally rectangular, and is adapted for conducting heat from a top surface of the flip chip 44. An upper surface of the metal plate 30 is adapted for transferring heat to the bottom surface 15 of the chassis of the heat sink 10.

In pre-assembly, a material 45 (FIG. 1) having low thermal resistance, such as a thermal grease, is conventionally arranged between the upper surface of the metal plate 30 and the bottom surface 15 of the chassis 14 of the heat sink 10, for removing gaps between the chassis 14 and the metal plate and thus facilitating transfer of heat from the metal plate 30 to the heat sink 10.

Figure 3:
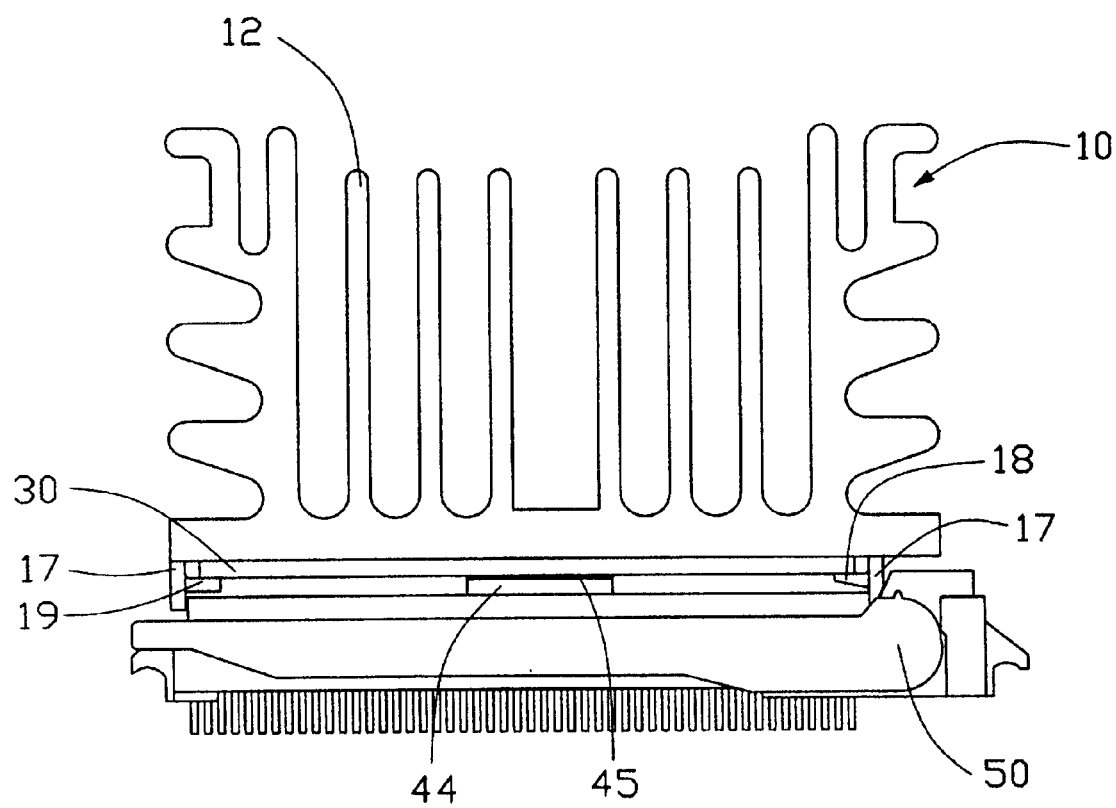
FIG. 3 is a side elevation view of FIG. 2.

Referring to FIG. 3, in assembly, the metal plate 30 is attached to the bottom surface 15 of the chassis 14 using a conventional tool. The flanges 18, 19 are bent inwardly, to firmly fasten the metal plate 30 to the bottom surface 15 of the heat sink 10. The flip chip processor 40 is inserted into the socket 50. The heat dissipation assembly 20 is mounted on the flip chip processor 40, with the bottom surface of the metal plate 30 contacting the top surface of the flip chip 44. The tabs 17 of the heat sink 10 interferentially engage with respective opposite sides of the substrate 42 of the flip chip processor 40. Thus the heat sink 10 is prevented from moving relative to the flip chip processor 40 when subjected to vibration and shock during normal operation.

Figure 4:
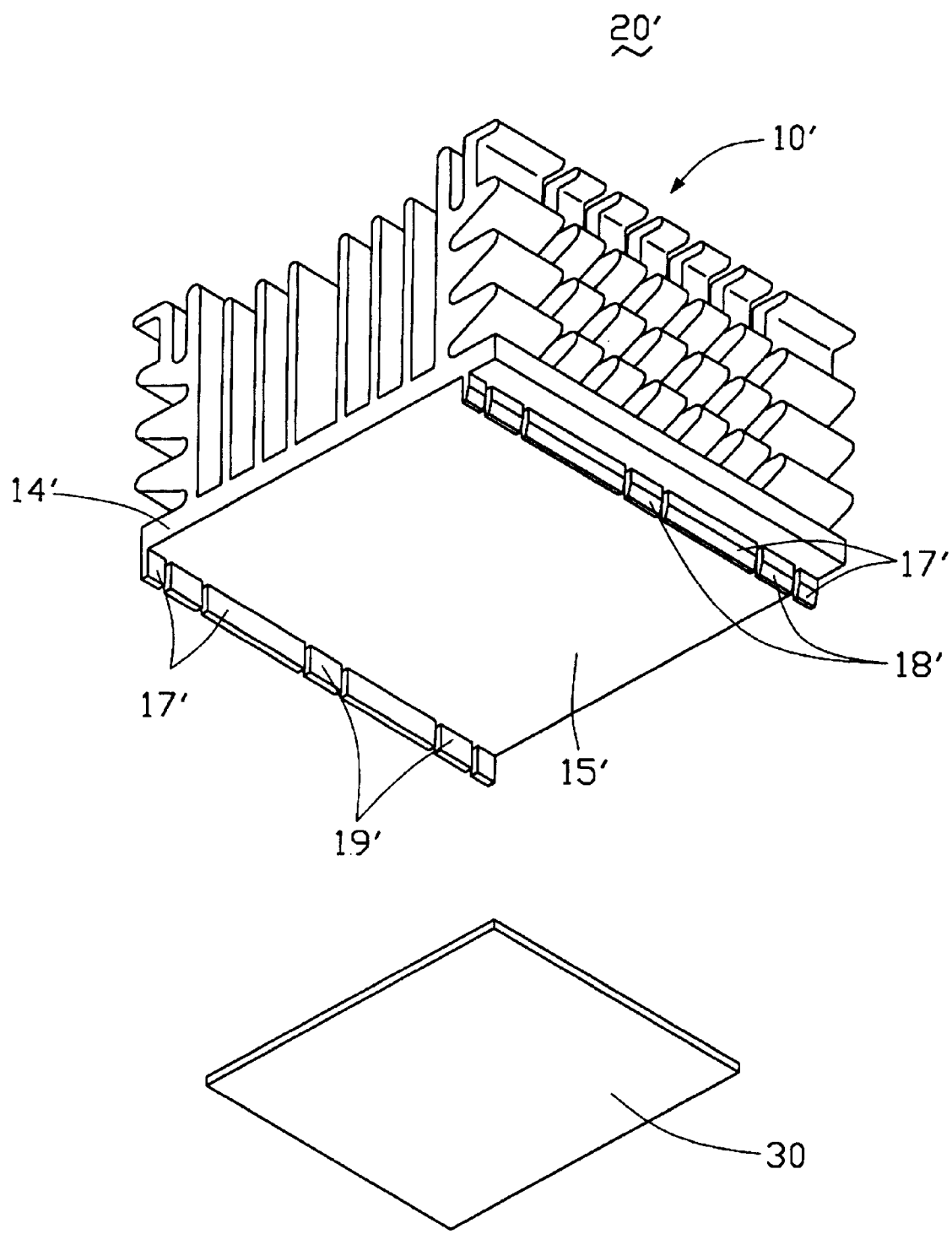
FIG. 4 is an exploded view of a heat dissipation assembly in accordance with an alternative embodiment of the present invention.
Figure 5:
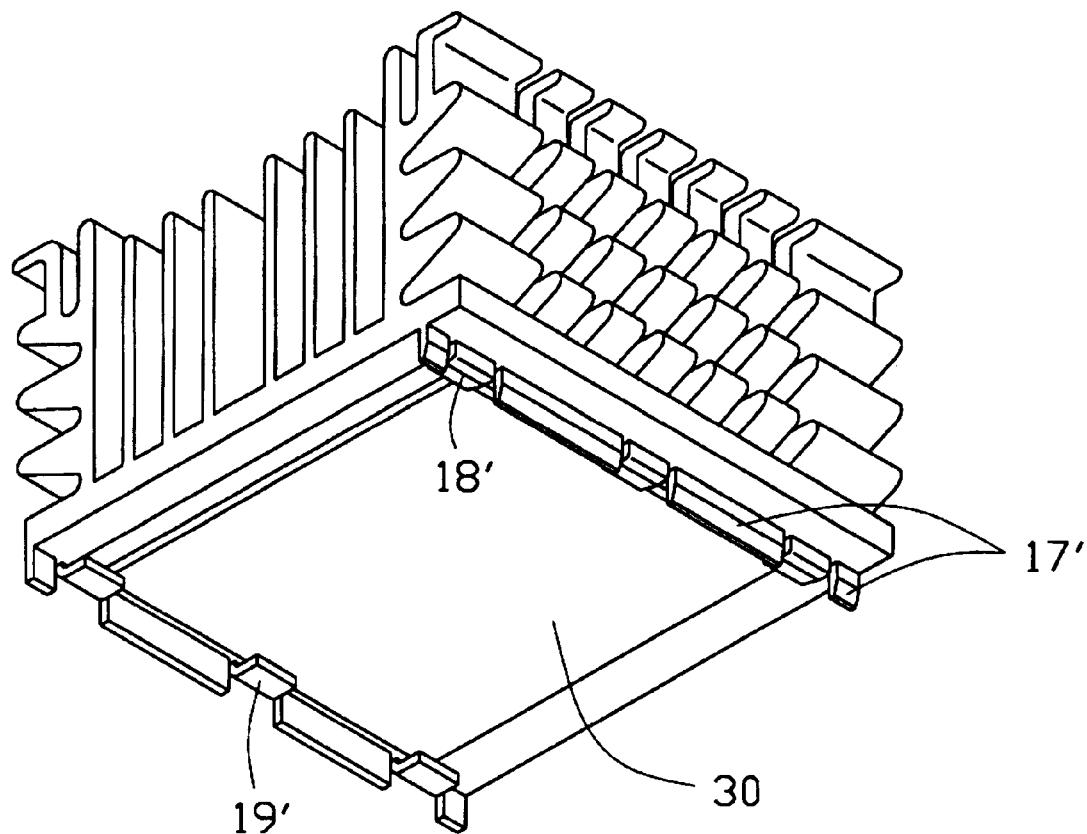
FIG. 5 is an assembled view of FIG. 4.

Referring also to FIGS. 4–5, a heat dissipation assembly 20' in accordance with an alternative embodiment of the present invention comprises a heat sink 10' and a metal plate 30. The heat dissipation assembly 20' is similar to the heat dissipation assembly 20 of the preferred embodiment discussed with reference to FIGS. 1–3. However, the heat sink 10' comprises more tabs 17' and a plurality of first flanges 18' on one side of the bottom surface 15' of the heat sink 10', and more tabs 17' and a plurality of second flanges 19' on an opposite side of the bottom surface 15' of the heat sink 10'. The flanges 18', 19' are respectively shorter than the flanges 18, 19 of the preferred embodiment. The tabs 17' and first flanges 18' are alternately disposed at one said side of the bottom surface 15' of the heat sink 10'. The tabs 17' and second flanges 19' are alternately disposed at the opposite said side of the bottom surface 15' of the heat sink 10'. For brevity, further detailed description of the heat dissipation assembly 20' is omitted herein. Instead, reference is made to the detailed description of the heat dissipation assembly 20, with due alteration of details.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat dissipation assembly, comprising:
   a heat sink made of a first thermal conductive material, the heat sink having a chassis with a bottom surface, at least one first flange and at least one second flange respectively depending from two opposite sides of the bottom surface, at least one tab being formed on each opposite side of the bottom surface of the chassis of the heat sink, the tabs being adapted for attaching the heat dissipation assembly to an electronic device; and
   a metal plate made of a second thermal conductive material, wherein the metal plate is secured between the at least one first and second flanges of the heat sink and attached to the bottom surface of the chassis of the heat sink.

2. The heat dissipation assembly as recited in claim 1, wherein the at least one first and second flanges are bent inwardly to securely fasten the metal plate to the bottom surface of the heat sink.

3. The heat dissipation assembly as recited in claim 1, wherein the second thermal conductive material has better heat transfer characteristics than the first thermal conductive material.

4. The heat dissipation assembly as recited in claim 1, wherein the tabs of the heat sink prevent the heat sink from moving relative to the electronic device.

5. The heat dissipation assembly as recited in claim 1, wherein a material with low thermal resistance is interposed between the metal plate and the heat sink, for facilitating heat conduction.

6. The heat dissipation assembly as recited in claim 1, wherein a plurality of tabs and a plurality of first flanges are formed on one said side of the bottom surface of the chassis of the heat sink, and wherein a plurality of tabs and a plurality of second flanges are formed on the opposite said side of the bottom surface of the chassis of the heat sink.

7. The heat dissipation assembly as recited in claim 6, wherein the tabs and first flanges are alternately disposed at one said side of the bottom surface of the heat sink, and wherein the tabs and second flanges are alternately disposed at the opposite said side of the bottom surface of the heat sink.

8. A heat dissipation assembly comprising:
   a socket;
   a chip processor positioned on the socket, said chip including a substrate and a flip chip;
   a heat sink having a chassis with opposite top and bottom surfaces thereof, a plurality of fins extending upwardly from the top surface, two opposite flanges and two opposite tabs extending downwardly from the bottom surface; and
   a metal plate attached to the bottom surface, said metal plate sandwiched between the heat sink and the chip processor and abutting against the flip chip; wherein
   said flanges retainably engage the metal plate and said tabs restrictively engage the substrate.

9. The assembly as recited in claim 8, wherein one of said flanges and one of said tabs on a side of the bottom surface of the chassis are aligned with each other.

10. The assembly as recited in claim 8, wherein said heat sink is made of a first terminal conductive material, while the metal plate is made of a second terminal conductive material better than the first one.

\* \* \* \* \*